United States Patent
Brox et al.

(10) Patent No.: US 7,855,463 B2
(45) Date of Patent: Dec. 21, 2010

(54) METHOD FOR PRODUCING A CIRCUIT MODULE COMPRISING AT LEAST ONE INTEGRATED CIRCUIT

(75) Inventors: Martin Brox, Munich (DE); Simon Muff, Mering (DE)

(73) Assignee: Qimonda AG, Munich (DE)

( * ) Notice: Subject to any disclaimer, the term of this patent is extended or adjusted under 35 U.S.C. 154(b) by 533 days.

(21) Appl. No.: 11/853,995

(22) Filed: Sep. 12, 2007

(65) Prior Publication Data

US 2008/0061423 A1    Mar. 13, 2008

(51) Int. Cl.
*H01L 23/48* (2006.01)
*H01L 21/44* (2006.01)

(52) U.S. Cl. .................. 257/786; 257/773; 257/777; 257/784; 257/E23.024; 257/E23.169; 438/666; 438/109; 438/617

(58) Field of Classification Search ............... 438/666, 438/109, 617; 257/784, 777, 773, 786, E23.024, 257/E23.169
See application file for complete search history.

(56) References Cited

U.S. PATENT DOCUMENTS

| | | | | |
|---|---|---|---|---|
| 4,959,704 A | * | 9/1990 | Isomura et al. | 257/208 |
| 5,103,282 A | * | 4/1992 | Isomura et al. | 257/211 |
| 6,355,980 B1 | | 3/2002 | Callahan | |
| 6,599,764 B1 | * | 7/2003 | Ang et al. | 438/15 |
| 6,617,196 B2 | * | 9/2003 | Iwaya et al. | 438/107 |
| 6,667,895 B2 | | 12/2003 | Jang et al. | |
| 2002/0041015 A1 | | 4/2002 | Kodaira et al. | |

FOREIGN PATENT DOCUMENTS

DE    10258722    6/2003

* cited by examiner

*Primary Examiner*—Nitin Parekh
(74) *Attorney, Agent, or Firm*—Patterson & Sheridan, LLP (57) ABSTRACT

An integrated circuit module comprises a chip, the chip comprising a substrate with a first main area and a second main area, the first main area comprising two half-sets of pads, the chip further comprising an integrated circuit with components and two half-sets of connection lines, the connection lines connecting the components of the integrated circuit to the pads, the integrated circuit further comprising a changeover device, the changeover device having two switching states in order to interchange the electrical assignment between the half-sets of the connection lines and the half-sets of the pads, and a carrier, the carrier comprising contact pieces. The chip is arranged on the carrier with one of the two main areas of the chip facing the carrier and the contact pieces of the carrier are connected to the pads of the chip, wherein one of the two switching states of the changeover device is selected, depending on which of the two main areas of the chip is the area facing the carrier.

26 Claims, 5 Drawing Sheets

METHOD FOR PRODUCING A CIRCUIT MODULE COMPRISING AT LEAST ONE INTEGRATED CIRCUIT

CROSS-REFERENCE TO RELATED APPLICATIONS

This application claims foreign priority benefits under 35 U.S.C. §119 to co-pending German patent application number DE 10 2006 042 775.0-33, filed 12 Sep. 2006. This related patent application is herein incorporated by reference in its entirety.

BACKGROUND OF THE INVENTION

1. Field of the Invention

The invention relates to a method of producing a circuit module containing at least one chip containing an integrated circuit on a carrier. The invention furthermore relates to an integrated circuit module.

2. Description of the Related Art

Integrated circuits are usually produced by means of a multiplicity of photolithographic steps on a semiconductor substrate, normally a large number of such circuits being formed simultaneously on a relatively large-area semiconductor slice, a so-called "wafer". After completion of the integration, the wafer is diced in order to obtain the individual circuits in the form of small "chips". Each integrated circuit contains a plurality of contact areas, referred to hereinafter as "primary pads", which are connected via individually assigned internal connection lines to other internal components of the circuit in order to transfer the electric currents and potentials required for operation.

Said pads form the connection points for the external connections of the integrated circuit to the outside world. Since the external connections cannot be miniaturized to the same extent as the integrated internal components, the pads must be relatively large in order to offer enough engagement area for the attachment of wires or for soldering connections.

A chip configured in the manner described above is positioned on the top side of a carrier, at which contact areas are situated, which are then electrically connected to the pads of the chip. For their part, said contact areas are connected to assigned contact pieces at the carrier, which contact pieces project at the underside of the carrier and can be formed as plug pins or as solder balls in order to fit or solder them together with corresponding mating contacts on a support.

There are two options for the relative orientation between chip and carrier when assembling these two parts. In order to describe the respective orientation, the side of the chip which is remote from the substrate and on which the primary pads are situated is referred to hereinafter as "front side", while the opposite side, where the substrate is situated, is referred to as "rear side".

The first option is a so-called "face-up" orientation. In this case, the chip is placed with its rear side downward onto the top side of the carrier, such that the primary pads are accessible for attaching connecting wires, the other ends of which are attached to the assigned contact areas of the carrier. In order to enable this "bonding", the carrier contact areas are arranged on edge regions of the carrier which project laterally beyond the chip.

The second option is a so-called "face-down" orientation. In this case, the chip is placed with its front side downward onto the top side of the carrier, the contact areas being arranged on the underside of the carrier in such a way that they can be connected to the pads of the chip via wires through an opening in the carrier.

The decision as to which of the two possible orientations of a chip relative to the carrier in a circuit module to be chosen depends on various circumstances. Depending on the stipulations for the carrier, one orientation of the chip may be more favorable than the other in order to produce the conductive connections between the primary pads of the chip and the carrier. Another standpoint is whether the module contains only a single chip or a plurality of chips stacked one above another on the carrier. In the case of a single-chip module, face-down orientation may be preferable because conducting line paths that are as short as possible then result. In the case of a stacked module, however, face-up orientation may be more advantageous because it is simpler to wire the pads of all the chips with the carrier.

A manufacturer of circuit modules should therefore be flexible in the choice of chip orientation with regard to the carrier.

SUMMARY OF THE INVENTION

One embodiment provides an integrated circuit module comprising a chip, the chip comprising a substrate with a first main area and a second main area, the first main area comprising two half-sets of pads, the chip further comprising an integrated circuit with components and two half-sets of connection lines, the connection lines connecting the components of the integrated circuit to the pads, the integrated circuit further comprising a changeover device, the changeover device having two switching states in order to interchange the electrical assignment between the half-sets of the connection lines and the half-sets of the pads. The integrated circuit further comprises a carrier, the carrier comprising contact pieces. The chip is arranged on the carrier with one of the two main areas of the chip facing the carrier and the contact pieces of the carrier are connected to the pads of the chip. One of the two switching states of the changeover device is selected, depending on which of the two main areas of the chip is the area facing the carrier.

BRIEF DESCRIPTION OF THE DRAWINGS

The features of embodiments will become clear from the following description, taking in conjunction with the accompanying drawings. It is to be noted, however, that the accompanying drawings illustrate only typical embodiments and are, therefore, not to be considered limiting of the scope of the invention. It may admit other equally effective embodiments.

In the figures, elements of identical type are designated by the same upper-case letters in each case, succeeded by a respective number for the purpose of closer identification. In the description below, a colon between two such numbers should be read as the word "to". Thus, by way of example, "pads P1:8" should be read as "pads P1 to P8".

DETAILED DESCRIPTION OF THE PREFERRED EMBODIMENT

Figure 1:
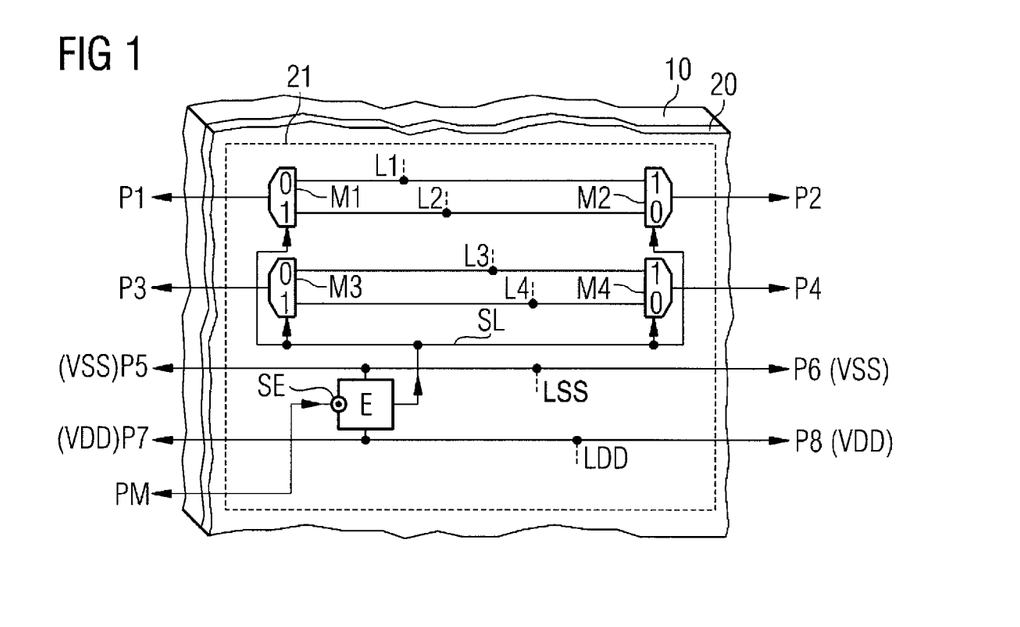
FIG. 1 shows the schematic circuit diagram of a changeover device that is contained in the integrated circuit of a chip and serves for interchanging the assignment between internal connection lines and pads of the chip.

FIG. 1 shows, bordered by a dashed frame, the circuit diagram of a changeover device 21, which is only one part of a much more extensive integrated circuit formed overall by a multilayered integration layer 20 on a semiconductor substrate 10. Said circuit can be any desired semiconductor circuit having a great multiplicity of semiconductor and metallization elements, for example a digital memory circuit. The circuit has a plurality of internal connection lines, which are indicated as short vertical lines in FIG. 1, for transferring electric currents and potentials between components of the circuit and assigned contacts (not shown in FIG. 1) that are connected to the outside world during operation.

In order to retain clarity in the representation of the drawing, it is assumed below as an example that N=4 internal connection lines L1:4 are provided for transferring signals. In reality, the number N of signal connection lines can be much greater. Two further connection lines LDD and LSS are the "supply lines" for transferring the two potentials, VDD and VSS of the supply voltage to the components of the integrated circuit.

Figure 2:
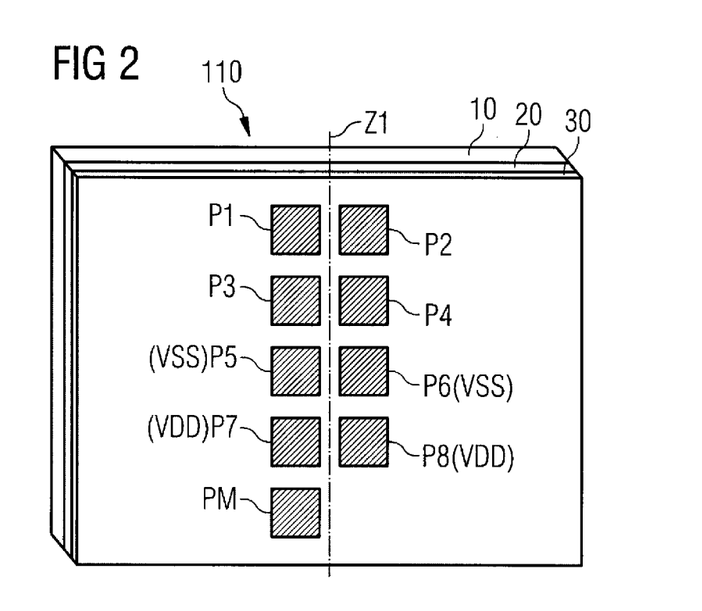
FIG. 2 shows the arrangement of the pads on the front side of a chip containing the changeover device according to FIG. 1.

In order to be able to connect the N=4 signal connection lines L1:4 and the supply connection lines LSS and LDD to the outside world, a plurality of "primary" pads P1:8 are provided, which are formed as relatively large-area metallizations likewise on the top side of the integration layer 20. Said pads are not shown in FIG. 1 for reasons of clarity; their spatial arrangement on the chip area is illustrated in FIG. 2. As can be discerned in FIG. 2, the pads P1:8 form a pattern in two series which comprises two halves on both sides of a reference line Z1. The first half contains the odd-numbered pads P1, P3, P5, P7, and the other half contains the even-numbered pads P2, P4, P6, P8. The pads P1:8 are exposed through corresponding etched openings in an insulating cover layer 30, which covers all the other parts of the integrated circuit of the chip.

In FIG. 1, the connections from the changeover device 21 to the primary pads P1:8 are indicated by correspondingly designated arrows. Accordingly, the N=4 primary pads P1:4 are assigned to the N=4 signal connection lines L1:4. The supply line LSS is connected to the two pads P5 and P6, and the supply line LDD is connected to the two pads P7 and P8.

The changeover device 21 shown in FIG. 1 forms an interface that can be changed over between the connection lines L1:4 and the pads P1:4. The changeover device 21 contains an input circuit E and a plurality of changeover switches M1:4, which are individually and fixedly-assigned to the pads P1:4. That is to say that precisely one changeover switch M is provided for each of said pads. In FIG. 1 the changeover switches M are represented by the customary multiplexer symbols, with two branch connections on one side and a main connection on the other side. The two branch connections of each changeover switch M are designated by "0" and "1". A further connection at each changeover switch M is provided with an arrow in FIG. 1 and forms the control connection for applying a binary control signal. If the control signal at a changeover switch M has the one binary value "1", then the changeover switch is conditioned such that its "1" branch connection is connected to its main connection. If the control signal has the other binary value, the changeover switch connects its "0" branch connection to the main connection.

As indicated by arrows in FIG. 1, the main connection of each changeover switch M is connected to the pad P assigned thereto. Within the changeover device circuit 21, according to FIG. 1, the control connections of all the changeover switches M1:4 are connected to a common control line SL. The four internal signal connection lines L1:4 form two pairs, each of which is assigned to a pair of the changeover switches M1:4. The lines L1:4 are connected to the branch connections of the changeover switches M1:4 in a scheme such that the changeover switches, if the control signal has the binary value "0", connect each of the lines L1:4 to the correspondingly numbered specimen of the pads P1:4. If the control signal has the binary value "1", then a mirror-inverted connecting pattern results: the changeover switches M1:4 then connect the odd-numbered lines L1, L3 to the even-numbered pads P2, P4 and the even-numbered lines L2, L4 to the odd-numbered pads P1, P3. That is to say that the assignment between the half-sets of the pads P1:4, on the one hand, and two half-sets of the connection lines L1:4, on the other hand, can be reversed by means of the control signal.

It should be assumed for the exemplary embodiments described here that the binary value "1" of the control signal corresponds to the supply potential VDD, and that the binary value "0" of the control signal corresponds to the supply potential VSS. In accordance with FIG. 1, the control line SL is connected to the output of the input circuit E, the input SE of which forms the control input of the entire changeover device 21. Said control input SE is connected to an additional pad PM, which is formed in a similar manner to the other pads on the top side of the chip 110, as is shown in FIG. 2. The input circuit E has two supply potential connections, one of which is connected to the supply line LSS (or to the supply pad P5 or P6), and the other of which is connected to the supply line LDD (or to the supply pad P7 or P8). The input circuit E is formed in such a way that it supplies the binary value "1" at its output precisely when the supply potential VDD (that is to say the "1" potential) is received at the control input SE. Otherwise, it supplies the binary value "0".

Figure 3:
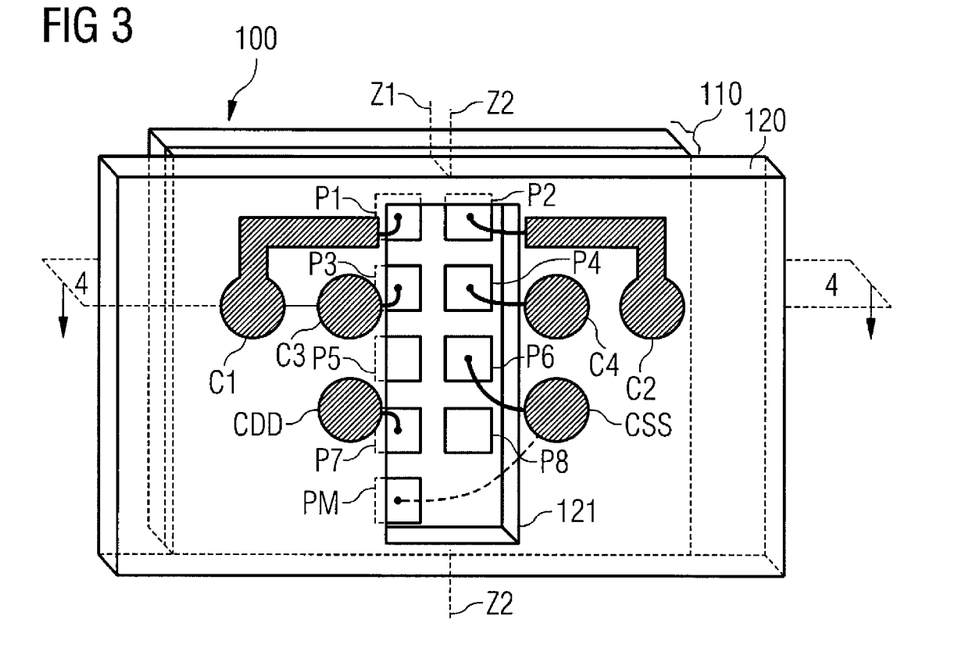
FIG. 3 shows a view of the underside of a module containing the chip according to FIG. 2 in a face-down orientation on a carrier.
Figure 4:
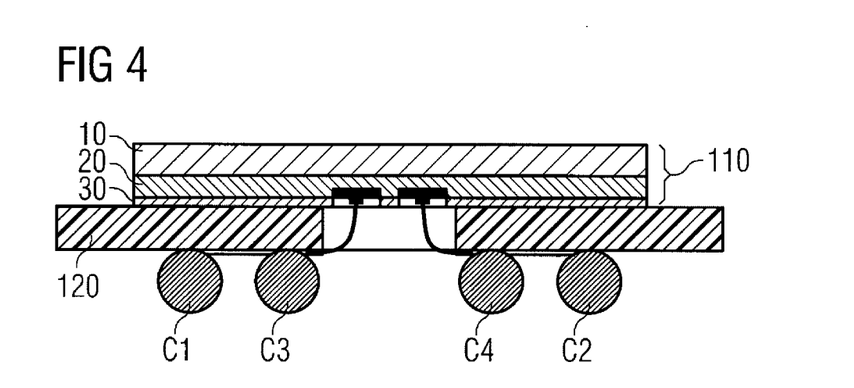
FIG. 4 is a sectional view of the module according to FIG. 3.

FIG. 3 and FIG. 4 illustrate how the chip 110 shown in FIG. 2 can be combined in face-down orientation with a carrier 120 in order to form a module 100, which can be placed onto a support for operation. FIG. 3 shows the module 100 in a view from below, that is to say in a view of the underside of the carrier 120. FIG. 4 shows a cross section through the module 100 in accordance with the sectional plane 4 indicated in FIG. 3, to be precise in a viewing direction indicated by arrows in FIG. 3.

The carrier 120, composed of an insulating material, has an opening 121, which permits access to the overlying pads P1:8 of the chip 110. Situated on the underside of the carrier 120 are four contact pieces C1:4 for signals, and two contact pieces CSS and CDD for the two supply potentials VSS and VDD. In the case shown, the contact pieces are formed as balls of soldering material. These solder balls are applied to assigned metallizations at the underside of the carrier 120.

The pattern of the contact pieces C1:4 likewise forms two half-sets on both sides of a reference line Z2. In the case shown, the contact pieces C1:4 are arranged on each side of the reference line Z2 as pairs lying alongside one another, such that the area at the underside of the carrier 120 is utilized better in order that the contact pieces can be made significantly larger and be arranged at a larger mutual distance than the pads P1:4 of the chip 110. The connections between the contact pieces C1:4 and the pads P1:4 are produced by wires that are led through the opening 121. Said connections are placed such that the contact pieces C1, C3 of the left-hand half-set are connected to the pads P1, P3 of the left-hand half-set, and that the contact pieces C2, C4 of the right-hand half-set are connected to the pads P2, P4 of the right-hand half-set. This has the advantage that the connecting paths are as short as possible and do not cross one another.

The contact piece CSS is arranged to the right of the opening 121 and connected via a wire to the nearest pad P6 of the two pads P6, P8, which are connected to the internal connection line LSS for the supply potential VSS on the chip 110. The contact piece CDD is arranged to the left of the opening 121 and connected via a wire to the nearest pad P7 of the two pads P5, P7, which are connected to the internal connection line LDD for the supply potential VDD on the chip 110.

The wire connections shown in FIGS. 3 and 4 are produced before the application of the solder balls, the wires being attached to the metallizations which are assigned to the contact pieces C1:8. In order to keep all the wires as short as possible, the metallizations for the contact pieces C1, C2, C5, C7, which lie relatively far away from the opening 121, are lengthened to close to the edge of the opening.

During the operation of the module, each of the internal signal connection lines L1:4 is intended to be connected to the respectively identically numbered specimen of the contact pieces C1:4. The contact piece CDD is the one to which the supply potential VDD corresponding to the binary value "1" is intended to be applied during operation. The contact piece CSS serves for application of supply potential VSS corresponding to the binary value "0". During operation, therefore, the pad P7 and hence the internal line LDD are at VDD potential, and the pad P6, and hence the line LSS, are at VSS potential. The additional pad PM connected to the control input SE has no electrical connection to any contacts of the carrier 120, such that the output of the control circuit E supplies the binary value "0". Consequently, the control signal for the changeover switches M1:4 also goes to the binary value "0", such that all the changeover switches connect their "0" branch connection to their main connection. Accordingly, the connection lines L1:4 are connected to the contact pieces C1:4 according to their numberings.

Figure 5:
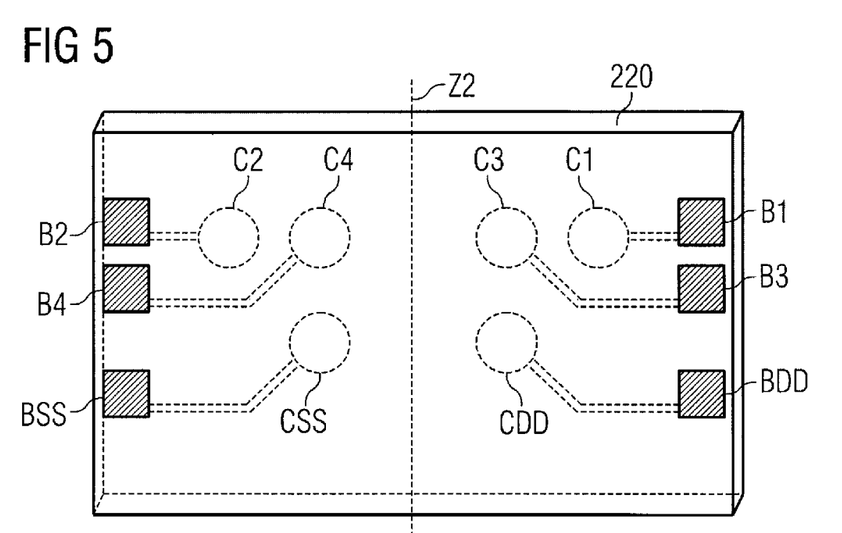
FIG. 5 shows a carrier for a face-up orientation of the chip.

The same assignment between the connection lines L1:4 and the contact pieces C1:4 is also intended to arise when the chip 110 is positioned in a face-up orientation on a carrier having, at its underside, the same pattern of contact pieces C1:4, CSS and CDD as is shown in FIG. 3 in connection with the face-down orientation. FIG. 5 shows such a carrier 220 formed for the face-up orientation of the chip, in a view from above. The contact pieces C1:4, CSS and CDD situated at the underside of the carrier 220 are depicted by dashed lines. Said contact pieces, which are formed and arranged in exactly the same way as the contact pieces at the underside of the carrier 120 described above, are electrically connected via conductor tracks (likewise depicted by dashed lines) and metallic feedthroughs to assigned bonding pads B1:4, BSS and BDD situated as so-called "landing" pads on the top side of the carrier 220 in order to be able to attach connecting wires there.

The total of six landing pads B1:4, BSS, BDD form two series, each having three pads on the two projecting lateral edge regions of the carrier 220. One series comprises the odd-numbered landing pads B1, B3 and the landing pad BDD. The other series comprises the even-numbered landing pads B2, B4 and the landing pad BSS.

The connections between the contact pieces C1:4, CSS, CDD and the landing pads B1:4, BSS, BDD are placed such that the contact pieces of the left-hand half-set are connected to the landing pads at the left-hand edge, and that the contact pieces of the right-hand half-set are connected to the landing pads at the right-hand edge. Consequently, here as well, the connecting paths are short and do not cross one another.

Figure 6:
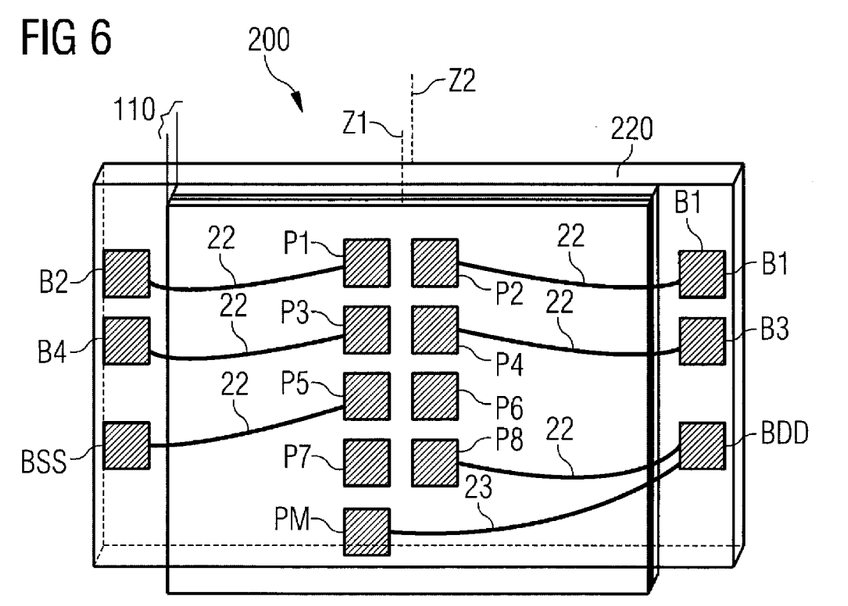
FIG. 6 shows a first embodiment of a module with the carrier according to FIG. 5 and a chip arranged thereon in a face-up orientation.

FIG. 6 shows a module 200 containing the carrier 220 according to 5 and the chip 110 shown in FIG. 2 in a face-up orientation. In the case of a face-up orientation, the pattern of the pads P1:8 of the chip 110 appears mirror-inverted relative to the carrier contact pieces C1:4, CSS, CDD in comparison with a face-down orientation. That is to say that the odd-numbered pads P1, P3, P5, P7 then lie on the same side of the reference line as the even-numbered contact pieces C2, C4 and the contact piece CSS of the carrier and therefore also on the same side as the even-numbered landing pads B2, B4 and the landing pad BSS of the carrier. The even-numbered pads P2, P4, P6, P8 lie on the same side as the odd-numbered contact pieces C1, C3 and the contact piece CDD of the carrier and therefore also on the same side as the odd-numbered landing pads B1, B3 and the landing pad BDD of the carrier.

Despite the mirror-inverted alignment of the pads P1:8, said pads can be connected to the landing pads B1:4, BSS, BDD in a crossover-free manner and in each case by a path with a very short distance, as shown by the wire connections 22 in FIG. 6, without having to relinquish the desired assignment between the contact pieces C1:4, CSS, CDD of the carrier 220 and the internal connections L1:4, LSS, LDD of the integrated circuit of the chip 110. As stated, the desired assignment consists in the fact that, during operation, the connection lines L1:4 are connected to the contact pieces C1:4 according to their numberings and that the connection line LSS is connected to the contact piece CSS, and that the connection line LDD is connected to the contact piece CDD.

For the line LSS, the desired assignment is produced by connecting the pad P5 to the landing pad BSS. For the line LDD, the desired assignment is produced by connecting the pad P8 to the landing pad BDD.

The desired assignment between L1:4 and C1:4 can be achieved by ensuring that, during operation, the control signal on the control line SL for the changeover switches M1:4 of the interface circuit 21 has the binary value "1". For this purpose it suffices to connect the additional pad PM to the landing pad BDD, as is shown by the wire 23 in FIG. 6. Consequently, the control input SE of the changeover device 21 receives the VDD potential, such that the output of the input circuit E and hence the control line SL go to "1".

During the production of the wire connections shown in FIG. 6, the primary pads P1:4, P5, P8 and the additional pad PM are likewise used as bonding pads in order to directly attach the bonding wires 22, 23 there. However, such a type of connection can pose certain problems if the primary pads and the additional pad are arranged in the central region of the chip area, as shown. A first problem is that the bonding wires in the case of such an arrangement are relatively long, and hence sensitive to mechanical effects that may occur during the bonding process by means of the bonding machine and during the encapsulation of the module. A second problem arises if a plurality of chips in a face-up orientation is intended to be stacked one above another in a module. This is because in the case of the wire routing shown in FIG. 6, it is difficult to arrange the required spacer between the stacked chips without mechanically stressing the wires.

These problems can be eliminated by ensuring that the bonding pads of the chip are positioned near the edges of the chip. For a face-down arrangement, by contrast, a central position of pads is more advantageous. In order to be able to realize the one or the other of the two pad positions as required, it is advantageous to configure the integration process for the pads in such a way that, firstly, a metallization layer with primary pads in a first positioning is formed and, as required, there is integrated above said layer an additional metallization layer, on which are situated secondary pads as bonding pads in the second positioning and at which suitable feedthroughs and conductor tracks are provided in order to connect said secondary pads to the primary pads of the underlying first metallization layer.

If the finished chip is intended to exhibit the first pad position on its front side, the integration process is ended after the formation of the first metallization layer. If the front side of the finished chip is intended to exhibit the second pad position, the integration process is continued and ended only after the formation of the additional metallization layer. That positioning for which the demand is greater is advantageously chosen for the primary pads. This is economic because the average outlay for chip-making is then the least.

One example of the formation of a circuit module containing chips having the additional metallization layer mentioned above is shown in FIG. 7. The production of this module is begun with a construction that is like the face-down module 200 according to FIG. 6, but with the difference that the chip 210 situated on the carrier 220 has an additional metallization layer 40 at the very top. Otherwise, the chip 210 is like the chip 110 shown in FIG. 2, including the changeover device 21 shown in FIG. 1. The additional metallization layer 40 is situated above the cover layer 30, in which the centrally positioned primary pads P1:8 and the additional pad PM are exposed. The primary pads P1:4 are connected via feedthroughs and conductor tracks of the layer 40 to secondary pads A1:4, ASS, ADD which are positioned on the top side of the layer 40 near those two edges which are adjacent to the landing pads of the carrier 220.

Figure 7:
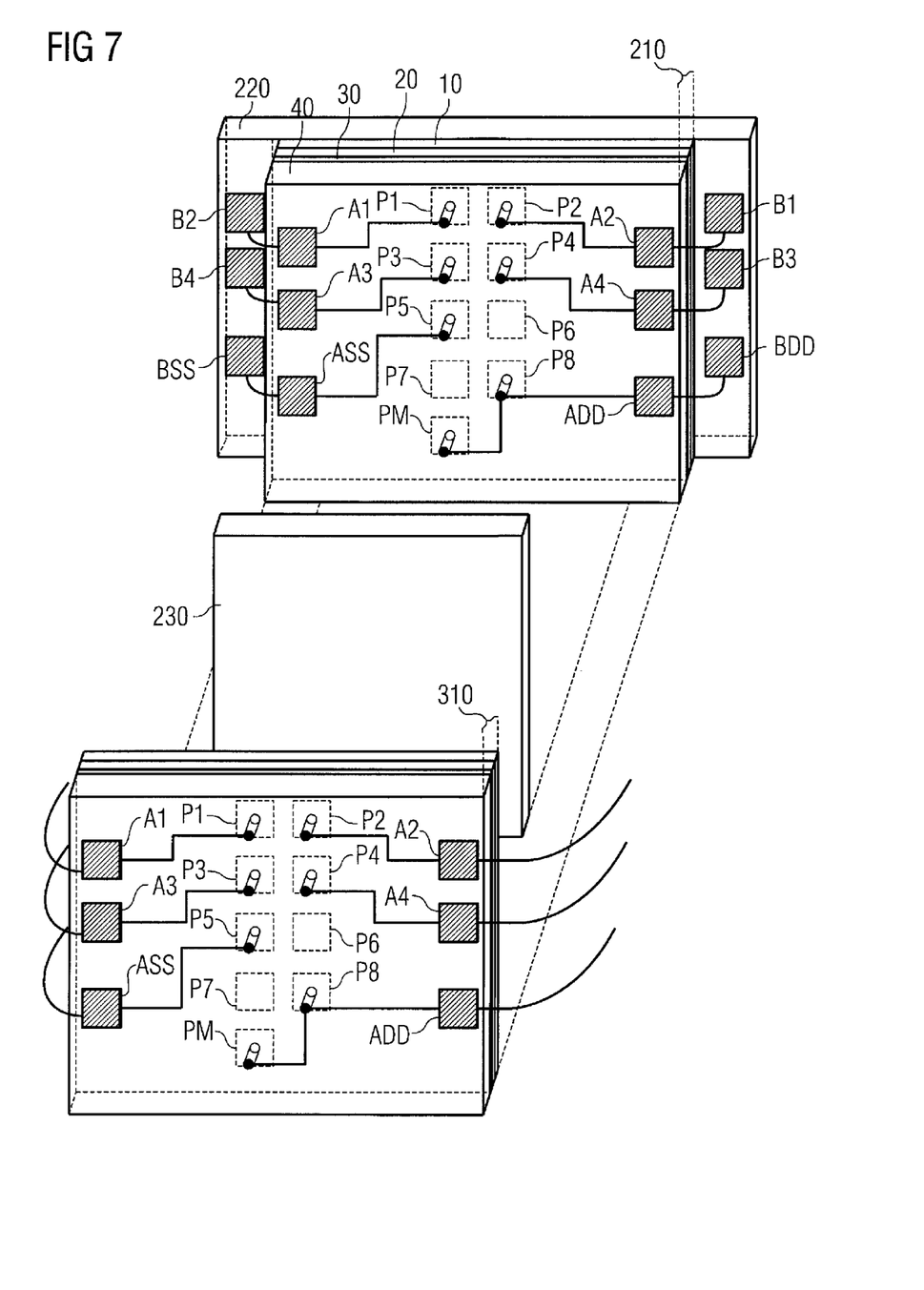
FIG. 7 illustrates in perspective representation the steps of assembling a stacked module containing two chips in a face-up arrangement on a carrier according to FIG. 5.

After the joining together of the chip 210 with the carrier 220, the secondary pads A1:4, ASS, ADD are connected to the respectively adjacent landing pads B1:4, BSS, BDD of the carrier by means of wires, as shown in FIG. 7. The arrangement is such that, by means of these short wires, the secondary pads and the conductor tracks of the layer 40, the same connections between the landing pads B1:4, BSS, BDD of the carrier 220 and the primary pads P1:4, P5, P8 of the chip 210 are produced as are created by the long bonding wires 22 in the module 200 according to FIG. 6. In the embodiment according to FIG. 7, the wiring 23 shown in FIG. 6 between the additional pad PM and the landing pad BDD is replaced by an additional conductor track at the metallization layer 40, which connects the additional pad PM to the secondary pad ADD, which is wired with the landing pad BDD of the carrier 220, which pad is at the supply potential VDD during operation.

Consequently, the construction of the chip 210 with the carrier 220 as shown in FIG. 7 functions in exactly the same way as has been described above for the module 200 according to FIG. 6. This construction has the advantage of short wire connections by virtue of the position of the secondary pads A1:4, ASS, ADD near the edges. A further advantage of this pad position is the stackability of a plurality of chips one above another. As likewise shown in FIG. 7, a relatively large-area spacer 230 can be adhesively bonded onto the front side of the chip 210 wired with the carrier 220, without disturbing the wire connections. A second chip 310 in face-up orientation can then be adhesively bonded onto said spacer 230, said second chip likewise having bonding pads at its front side, which are then connected via further bonding wires to landing pads at the carrier. In the example shown, said second chip 310 is formed in exactly the same way as the chip 210, and its secondary pads A1:4, ASS, ADD are connected to the landing pads B1:4, BSS, BDD of the carrier 220 according to the same scheme as in the case of the chip 210. The two chips 210 and 310 are thereby connected in parallel, in which case individual addressing can be effected by means of code words. Such an arrangement may be expedient e.g. when memory chips are involved, which are often operated in parallel connection.

It is not mandatory, however, for the chips on the carrier to contain the same integrated circuit in each case or even to be connected in parallel. If other or additional electrical connections to the outside world are required for the second chip, the carrier can be provided with corresponding additional contact pieces and assigned landing pads. Furthermore, it should be mentioned that with the technique illustrated in FIG. 7, it is also possible, of course, to stack more than two chips in face-up orientation one above another, in each case with interposition of a spacer. Moreover, in an embodiment where multiple chips are stacked in a face-up orientation, it is not necessary for the top-most chip to have the bonding positioned near the edges of the chip.

Figure 8:
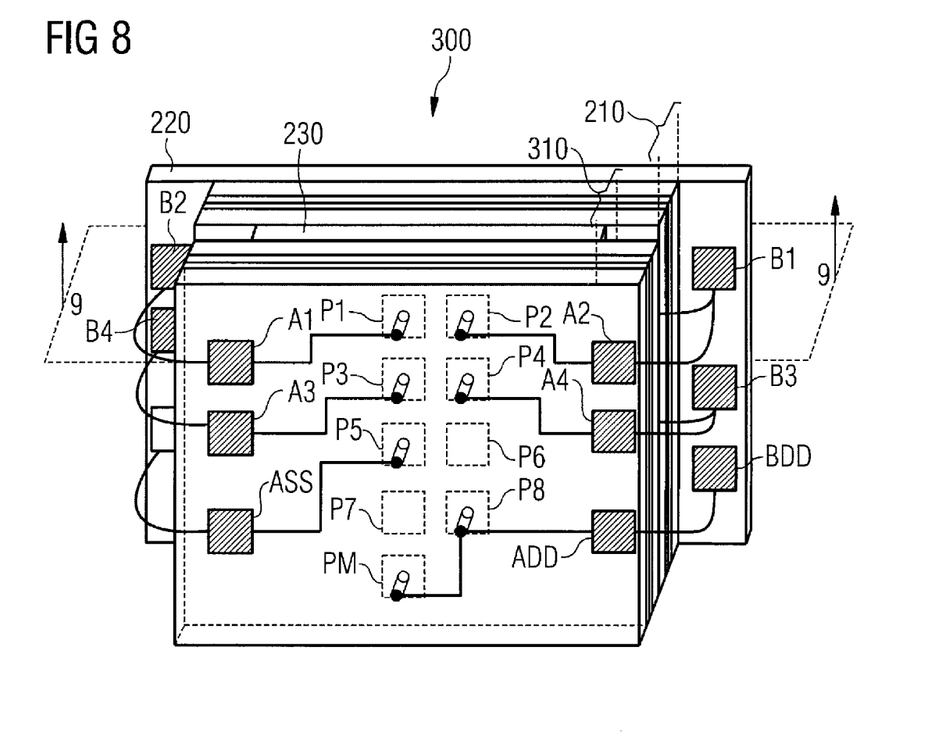
FIG. 8 shows the stacked module assembled in accordance with 7.
Figure 9:
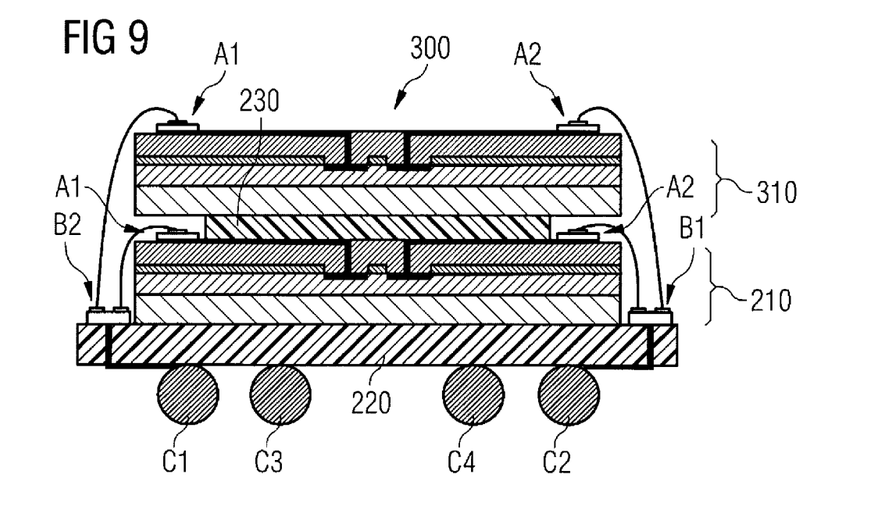
FIG. 9 is a sectional view of the stacked module according to FIG. 8.

FIG. 8 shows in a perspective view, for the sake of clarity, the module 300 composed of the carrier 220, the two chips 210, 220 and the spacer 230 after completion of the wiring. FIG. 9 is a sectional view of this module according to the sectional profile 9 depicted by dashed lines in FIG. 8, and in a viewing direction indicated by the arrows. The position (which cannot be illustrated in FIG. 5) of the feedthroughs at the carrier 220 and also the ball-like shape of the contact pieces at the underside of the carrier 220 can be discerned in FIG. 9. After the assembly of the construction shown in FIGS. 8 and 9, the module is encapsulated all around (with the exception of the underside) in the customary manner in order to form a robust housing.

The embodiments described above with reference to the figures are only examples, and the highly simplified representations in the drawings are merely intended to illustrate the principle of the invention. The various parts are not depicted to scale, particularly as far as the thickness of the various layers is concerned. In the examples shown, the primary pads, the contact pieces at the carrier and also the bonding pads and the landing pads in each case form a pattern which is precisely mirror-symmetrical with respect to the relevant reference line Z1 or Z2. Such a symmetry is advantageous, but not a necessary prerequisite. Moreover, it is not mandatory for the reference lines Z1 and Z2 to coincide precisely with the center line of the module, as is shown in the figures. Moreover, the reference lines Z1, Z2 need not be congruent with one another; they can also lie laterally offset with respect to one another or be angularly offset with respect to one another to a certain extent.

The invention is not restricted to the embodiments described. For the realization of the invention, various other variants and also further configurations are possible, some of which are indicated below.

The principle of the invention can also be applied in conjunction with chips in which primary pads are integrated at the edge regions on the chips. In this case, it is possible to use the primary pads in the face-up orientation of the module as bonding pads, such that no further metallization layer is required for forming secondary pads. In this case, the additional pad should also lie near the edge in order to be able to produce its electrical connection to the carrier via a short wire connection that keeps the central region of the chip area free. If the intention is to arrange a chip with primary pads near the edges in face-down orientation on a carrier having the structure of the carrier 120 according to FIGS. 3 and 4, then the connection of the primary pads P1:8 to the central feedthroughs situated in the carrier 120 can be effected by means of an additional metallization layer integrated on the chip.

In the case of the embodiment described in FIGS. 7 to 9, the connection between the control line SL and that contact piece CDD of the carrier which is selected for the supply potential VDD is produced if the chips are arranged in face-up orientation. In the case of face-down orientation according to FIGS. 3 and 4, the control line SL remains without connection to CDD. As an alternative, it is also possible to form the changeover device between the primary signal pads P1:4 and the connection lines L1:4 in such a way as to result in the desired assignment between said lines and the contact pieces of the carrier if the connection between SL and CDD is produced in the case of face-down orientation and is lacking in the case of face-up orientation. A corresponding variant of the changeover device need differ from the changeover device 21 according to FIG. 1 only in that the 0 connections and the 1 connections of the changeover switches M1:4 are interchanged.

The input circuit E of the changeover device 21 can be any suitable circuit which supplies the binary value "1" if the control input SE receives the "1" potential VDD, and supplies the binary value "0" if the control input SE is potential-free. A very simple embodiment consists in connecting the control input SE (or the additional pad PM) directly to the control line SL and connecting it to the supply line LSS in high-resistance fashion.

However, the input circuit E can also be formed in such a way that it supplies the binary value "1" precisely when the control input SE receives the "1" potential VDD, and supplies the binary value "0" precisely when the control input SE receives the "0" potential VSS. In the case of such an embodiment (which can be realized in the simplest case by direct connection between SE and the control line SL), the additional pad PM must always be connected to a supply contact piece of the carrier, either to a VDD contact piece or to a VSS contact piece, depending on the desired switching state of the changeover device 21. FIG. 3 illustrates such a connection between PM and CSS by means of the wire connection depicted in a dashed manner.

In the embodiments illustrated in the drawings, the carriers 120, 220 contain, for each of the two supply potentials VSS and VDD, in each case only one contact piece BSS and BDD, respectively. If desired, it is possible to provide for each of the supply potentials in each case two contact pieces which form a similar arrangement to the signal contact pieces C1:4, a VSS contact piece and a VDD contact piece in each case lying on each side of the reference line Z2. In the case of such an embodiment, each of the two VSS contact pieces is connected to the respectively nearest pad of the pad pair P5, P6, and each of the VDD contact pieces is connected to the respectively nearest pad of the pad pair P7, P8. For the face-up arrangement according to FIGS. 5 to 9, corresponding additional supply landing pads are to be provided in order to be able to produce all of these connections.

Finally, it should also be mentioned that the support of the carrier, which has the mating contacts with respect to the contact pieces of the carrier, can be directly a circuit board, which can also carry other modules as well. However, the support can also be a base which is itself part of the module and, for its part, is provided with external contacts for electrically connecting the module to a circuit board.

While the foregoing is directed to embodiments of the present invention, other and further embodiments of the invention may be devised without departing from the basic scope thereof, and the scope thereof is determined by the claims that follow.

What is claimed is:

1. A method of producing an integrated circuit module comprising:
   providing a chip, the chip comprising:
      a substrate with a first main area and a second main area, wherein the first main area comprising two half-sets of pads;
      an integrated circuit comprising:
         components;
         two half-sets of connection lines, wherein the connection lines electrically connect the components of the integrated circuit to the respective two half-sets of pads; and
         a changeover device, wherein the changeover device has two switching states in order to interchange the electrical assignment between the half-sets of the connection lines and the half-sets of the pads;
   providing a carrier, wherein the carrier comprises contact pieces;
   arranging the chip on the carrier with one of the two main areas of the chip facing the carrier;
   electrically connecting the contact pieces of the carrier to the assigned pads of the chip; and
   selecting one of the two switching states of the changeover device, depending on which of the two main areas of the chip is the area facing the carrier.

2. The method as claimed in claim 1, wherein
   the changeover device is configured to be in a first switching state precisely when it receives a first supply potential at a control input, and
   depending on which of the two main areas of the chip is the area facing the carrier, a decision is made as to whether the control input of the changeover device is connected to a selected contact piece of the carrier to which the first supply potential is intended to be applied during the operation of the module.

3. The method as claimed in claim 2, wherein the changeover device is configured to be in a second switching state if the control input is potential-free.

4. The method as claimed in claim 2, wherein
   the changeover device is configured to be in a second switching state if the control input receives a second supply potential, and
   the control input of the changeover device, if it is not connected to the selected contact piece of the carrier, is connected to another selected contact piece to which the second supply potential is intended to be applied during an operation of the module.

5. The method as claimed in claim 2, wherein
   an additional pad connected to the control input of the changeover device is formed in a similar manner as the primary pads of the chip, and
   the connection of the control input to the selected contact piece of the carrier is produced by connecting the additional pad to said contact piece.

6. A method of producing a circuit module, the circuit module comprising:
- a carrier, which contains signal contact pieces and supply contact pieces; and
- at least one chip, each of which contains an integrated circuit with signal connection lines for transferring signals and supply connection lines for transferring supply potentials, respectively, between components of the integrated circuit and primary signal pads and primary supply pads, respectively,
- wherein the primary signal pads are integrated on the chip in two half-sets on both sides of a first reference line and electrically connected to assigned signal contact pieces, which are arranged at the carrier likewise in two half-sets on both sides of a second reference line,
- wherein the integrated circuit contains a changeover device, which is configured to change over between two switching states in order to interchange the electrical assignment between two half-sets of the signal connection lines, on the one hand, and the two half-sets of the primary signal pads, on the other hand,
- wherein the changeover is in a first switching state precisely when it receives a supply potential VDD at a control input, and
- wherein, depending on which of the two main areas of the chip is the area facing the carrier, a decision is made as to whether the control input is connected to a selected supply contact piece of the carrier to which the first supply potential is intended to be applied during an operation of the module.

7. The method as claimed in claim 6, wherein the changeover device is configured to be in a second switching state if the control input is potential-free.

8. The method as claimed in claim 6, wherein the changeover device is configured to be in a second switching state if the control input receives a second supply potential, and the control input, if it is not connected to the selected first supply contact piece of the carrier, is connected to a selected supply contact piece to which the second supply potential is intended to be applied during the operation of the module.

9. The method as claimed in claim 6, wherein an additional pad connected to the control input is formed in a similar manner as the primary pads of the chip, and the connection of the control input to the selected supply contact piece of the carrier is produced by connecting the additional pad to said contact piece.

10. The method as claimed in claim 9,
- wherein the carrier includes, on its top side, signal landing pads and a supply landing pad for each supply potential,
- wherein the landing pads are arranged in two groups at the two edge regions of the carrier on both sides of the second reference line, each half-set of the signal contact pieces of the carrier being electrically connected to the signal landing pads which lie on the same side of the second reference line as the relevant half-set, and each supply contact piece of the carrier being electrically connected to in each case one individually assigned supply landing pad,
- wherein the chip is arranged with its front side, which is remote from the substrate, upward on the top side of the carrier, and
- wherein connections are produced between the primary signal pads of each half-set and the signal landing pads, respectively lying on the same side of the first reference line, between primary supply pads and the supply landing pads and between the additional pad and that supply landing pad which is connected to the selected supply contact piece of the carrier.

11. The method as claimed in claim 10, wherein
- all the primary pads are integrated in a central region of the chip,
- a further layer is integrated on the front side of the chip, said further layer having secondary pads at the edge regions of its surface on both sides of the first reference line, said secondary pads being formed as bonding pads for producing crossover-free wire connections to the landing pads of the carrier, the further layer containing a conductor structure which connects the secondary pads to assigned primary pads and connects a secondary pad, which is intended to be connected to the selected supply contact piece of the carrier, to the additional pad,
- the chip thus formed, as first chip, is subsequently arranged with its front side, which carries the secondary pads, upward on the top side of the carrier, such that said pads are aligned with the landing pads of the carrier, and
- each secondary pad is wired with the carrier's landing pad that is aligned with it.

12. The method as claimed in claim 11, wherein
- a second chip, which has bonding pads on the surface of its front side, is subsequently stacked with said side upward above the first chip, with interposition of a spacer composed of insulating material, and
- the pads situated on the surface of the second chip are wired with assigned landing pads of the carrier.

13. The method as claimed in claim 11, wherein
- at least two further chips, which have bonding pads on the surface of their front side, are subsequently stacked with in each case said side upward successively above the first chip, in each case with interposition of a spacer composed of an insulating material, the bonding pads of all the chips up to at least the penultimate chip being arranged at the lateral edge regions of the chips, and
- after each addition of a chip, its bonding pads are wired with assigned landing pads of the carrier.

14. An integrated circuit module, comprising:
- a chip, the chip comprising:
  - a substrate with a first main area and a second main area, the first main area comprising two half-sets of pads;
  - an integrated circuit, comprising:
    - components; and
    - two half-sets of connection lines, wherein the connection lines electrically connect the components of the integrated circuit to the respective half-set of pads;
  - a changeover device, the changeover device having two switching states in order to interchange the electrical assignment between the half-sets of the connection lines and the half-sets of the pads; and
- a carrier, the carrier comprising contact pieces,
- wherein the chip is arranged on the carrier with one of the two main areas of the chip facing the carrier,
- wherein the contact pieces of the carrier are electrically connected to the assigned pads of the chip, and
- wherein one of the two switching states of the changeover device is selected, depending on which of the two main areas of the chip is the area facing the carrier.

15. The module as claimed in claim 14, wherein
- the changeover device is configured to be in a first switching state precisely when it receives a first supply potential at a control input, and
- depending on which of the two main areas of the chip is the area facing the carrier, a decision is made as to whether the control input of the changeover device is connected to a selected contact piece of the carrier to which the first supply potential is intended to be applied during the operation of the module.

16. The module as claimed in claim 15, wherein the changeover device is configured to be in a second switching state if the control input is potential-free.

17. The module as claimed in claim 15, wherein
the changeover device is configured to be in a second switching state if the control input receives a second supply potential, and
the control input of the changeover device if it is not connected to the selected contact piece of the carrier, is connected to another selected contact piece to which the second supply potential is intended to be applied during an operation of the module.

18. The module as claimed in claim 15, wherein
an additional pad connected to the control input of the changeover device is formed in a similar manner as the primary pads with the pads of the chip, and
the connection of the control input to the selected contact piece of the carrier is produced by connecting the additional pad to said contact piece.

19. An integrated circuit module, comprising:
a carrier, which contains signal contact pieces and supply contact pieces; and
at least one chip, each of which contains an integrated circuit with signal connection lines for transferring signals and supply connection lines for transferring supply potentials, respectively, between components of the circuit and primary signal pads and primary supply pads, respectively,
wherein the primary signal pads are integrated on the chip in two half-sets on both sides of a first reference line and electrically connected to assigned signal contact pieces, which are arranged at the carrier likewise in two half-sets on both sides of a second reference line,
wherein the integrated circuit contains a changeover device configured to change over between two switching states in order to interchange the electrical assignment between two half-sets of the signal connection lines on the one hand, and the respective half-sets of the primary signal pads, on the other hand, and
wherein the changeover device is configured to be in a first switching state in which it produces a first assignment between the signal connection lines and the assigned signal contact pieces of the carrier precisely when it receives a predetermined supply potential at a control input.

20. The module as claimed in claim 19, wherein the control input is connected to a selected contact piece of the carrier to which a supply potential is intended to be applied during an operation of the module.

21. The module as claimed in claim 19, wherein
the integrated circuit contains an additional pad in the integration layer of the primary pads, said additional pad being connected to the control input of the changeover device, and
the additional pad is connected to the selected contact piece of the carrier.

22. The module as claimed in claim 19, wherein the carrier has, on its top side, signal landing pads and a supply landing pad for each supply potential,
wherein the landing pads are arranged in two groups at the two edge regions of the carrier on both sides of the second reference line, each half-set of the signal contact pieces of the carrier being electrically connected to the signal landing pads which lie on the same side of the reference line as the relevant half-set, and each supply contact piece of the carrier being electrically connected to in each case one individually assigned supply landing pad,
wherein the chip is arranged with its front side, which is remote from the substrate, upward on the top side of the carrier, and
wherein connections are produced between the primary signal pads of each half-set and the signal landing pads, respectively lying on the same side of the first reference line, between primary supply pads and the supply landing pads and between the additional pad and that supply landing pad which is connected to the selected supply contact piece of the carrier.

23. The module as claimed in claim 22, wherein
all the primary pads are integrated in the central region of the chip area,
a further layer is integrated on the front side of the chip, said further layer having secondary pads at the edge regions of its surface on both sides of the first reference line, said secondary pads being formed as bonding pads for producing crossover-free wire connections to the landing pads of the carrier, the further layer containing a conductor structure which connects the secondary pads to assigned primary pads and connects a secondary pad, which is intended to be connected to the selected supply contact piece of the carrier, to the additional pad,
the chip is arranged in an orientation on the top side of the carrier such that the secondary pads are aligned with the landing pads of the carrier, and
each secondary pad is wired with the carrier's landing pad that is aligned with it.

24. The module as claimed in claim 23, wherein
the chip, and a second chip, which has bonding pads on the surface of its front side, are stacked with said front side of the second chip upward above the chip, with interposition of a spacer composed of insulating material, and
the pads situated on the surface of the second chip are wired with assigned landing pads of the carrier.

25. The module as claimed in claim 24, wherein
the chip, and at least two further chips, which have bonding pads on the surface of their front side, are stacked with in each case said side upward, in each case with interposition of a spacer composed of insulating material, the bonding pads of all the chips up to at least the penultimate chip being arranged at the lateral edge regions of the chips, and
the bonding pads of all the chips are wired with assigned landing pads of the carrier.

26. The module as claimed in claim 24, wherein all the chips are identical to one another.

* * * * *

UNITED STATES PATENT AND TRADEMARK OFFICE
CERTIFICATE OF CORRECTION

| | | |
|---|---|---|
| PATENT NO. | : 7,855,463 B2 | Page 1 of 1 |
| APPLICATION NO. | : 11/853995 | |
| DATED | : December 21, 2010 | |
| INVENTOR(S) | : Brox et al. | |

It is certified that error appears in the above-identified patent and that said Letters Patent is hereby corrected as shown below:

Title Page, Foreign Application Priority Data:

Please insert --(30)    Foreign Application Priority Data

Sep. 12, 2006    (DE) .........10 2006 042 775--.

Signed and Sealed this
Twenty-sixth Day of February, 2013

Teresa Stanek Rea
*Acting Director of the United States Patent and Trademark Office*